(12) United States Patent
Lifshitz et al.

(10) Patent No.: US 6,225,026 B1
(45) Date of Patent: *May 1, 2001

(54) PRINTING STENCIL AND A METHOD FOR PREPARATION THEREOF

(75) Inventors: Lior Lifshitz, Maoz Zion; Murray Figov, Ra'anana; Hannoch Ron, Ramat Gan, all of (IL)

(73) Assignee: Afrion Digital Ltd., Herzlia (IL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/177,074

(22) Filed: Oct. 19, 1998

(51) Int. Cl.[7] .................................................. G03F 9/00

(52) U.S. Cl. ........................... 430/308; 101/48; 101/112; 101/128.4

(58) Field of Search ............................ 430/5, 271.1, 306, 430/308; 101/112, 114, 121, 125, 126, 127, 129, 128.4, 48; 427/487, 504, 508, 510, 511

(56) References Cited

U.S. PATENT DOCUMENTS

| | | | |
|---|---|---|---|
| 4,262,084 | * | 4/1981 | Kinney .................................. 430/308 |
| 4,268,576 | * | 5/1981 | Montmarquet, Jr. ................. 428/342 |
| 5,262,275 | | 11/1993 | Fan ....................................... 273/430 |
| 5,607,814 | | 3/1997 | Fan ....................................... 258/430 |

(List continued on next page.)

FOREIGN PATENT DOCUMENTS 120565   3/1997   (IL) .

OTHER PUBLICATIONS

"Chemistry and Technology of UV and Eb Formulation for Coating, Ink & Paints", K.K. Dietliker, vol. 3, Chapter 9, SITA Technology Ltd., London, 1991 pp. 450–460.

(List continued on next page.)

*Primary Examiner*—Mark F. Huff
*Assistant Examiner*—Saleha R. Mohamedulla
(74) *Attorney, Agent, or Firm*—Eitan, Pearl, Latzer & Cohen-Zedek

(57) ABSTRACT

It is an object of the present invention to provide a printing stencil and a method for its preparation. There is thus provided, In accordance with a preferred embodiment of the present invention, a printing stencil comprising a porous stencil carrier layer, preferably of a non-woven tissue, which is impregnated with a solid or liquid radiation curable material. The printing stencil may further comprise a mask laid upon or integral to the stencil layer for defining areas transparent and areas non transparent to curing irradiation.

There is thus also provided, in accordance with a preferred embodiment of the present invention, a method for the preparation of a printing stencil, said printing stencil comprising a stencil carrier layer and a stencil layer, which is impregnated with a radiation curable material. The method comprises the step of selectively irradiating the stencil layer with curing radiation, thereby forming ink permeable and ink impermeable areas, said ink permeable areas consisting of uncured material and said ink impermeable areas consisting of cured material.

The method may further comprise the step of creating a mask on the stencil layer prior to irradiating it with curing radiation, for selectively blocking curing radiation by defining, on the printing stencil, areas exposed and areas unexposed to curing radiation.

The printing stencil of the present invention may be used in stencil duplicating processes for printing fine details, graphic elements and color printing at a higher quality than existing stencils, approaching offset lithographic standards.

18 Claims, 10 Drawing Sheets

U.S. PATENT DOCUMENTS

| | | | |
|---|---|---|---|
| 5,888,700 | * | 3/1999 | West et al. ............................ 430/302 |
| 5,914,211 | * | 6/1999 | Hashino et al. ...................... 430/166 |
| 5,934,197 | * | 8/1999 | Goulet .................................. 101/467 |
| 5,972,566 | * | 10/1999 | Venkataraman ...................... 430/306 |
| 5,992,314 | * | 11/1999 | Lorenz et al. ................... 101/128.21 |
| 6,063,835 | * | 5/2000 | Ohshima et al. ..................... 523/161 |

OTHER PUBLICATIONS

New Electron Transfer Photo Initiators For the Visible and the IR Region, K. Kuntz, A Cunningham C. De Leo/CIBA Specialty Chemicals Inc. Basle Switzerland, IS & T's $49^{th}$ Annual conference, 1996.

* cited by examiner

BASE MATERIAL

IMAGING

PRINTING

BASE
MATERIAL

IMAGING

PRINTING

BASE
MATERIAL

IMAGING

MATERIAL
EVACUATION

PRINTING

PRINTING STENCIL AND A METHOD FOR PREPARATION THEREOF

FIELD OF THE INVENTION

The present invention relates to a printing stencil prepared by utilizing radiation curing.

BACKGROUND OF THE INVENTION

Printing processes include stencil duplicating (mimeography) and screen-printing. These are processes which utilize stencils and in which ink is allowed to pass through ink permeable areas on the stencil (image areas) to the paper, thus printing an Image. Duplicating, usually a rotary process, is used for printing finer details than screen printing which is a flat bed process.

Various stencil making processes have been developed and used over the years, both for mimeography and screen-printing. The process of stencil making involves cutting out image areas in the stencil. This was originally done by hand cutting of the stencil material, Other methods used various mechanical means to cut the image areas in impregnated tissue or in free standing films. Electro-optical methods were also used for stencil cutting by IR absorption or Electro-erosion. Since the 1980's, thermal digital duplicators have been developed. In these machines, the stencil is cut using a thermal head to make holes in a thin polyester layer.

Examples of existing printing stencils and of their preparation are illustrated in FIGS. 1 and 2.

FIG. 1 illustrates a thermal stencil and describes the method for its preparation. The thermal stencil 10 consists of a thin polyester film 12 laminated on a fine tissue base 14. Holes 16 are made in the polyester film 12 using a thermal head 18. During printing, ink 15 becomes accessible to paper 13 through holes 16. This technology gives reasonable quality, short preparation time and is suitable for a digital work flow. It is used in all digital duplicators made at present.

FIG. 2 illustrates a laser thermal stencil and describes the method for its preparation. The laser thermal stencil 20 consists of an IR sensitive layer 22 and a thin polyester film 24 laminated on a paper tissue base 26. IL patent U.S. application No. 09/402,205, assigned to the common assignees and co-inventors of the present invention, discloses the use of a laser beam for cutting a stencil similar in its structure to the thermal stencil. Instead of using an electric thermal element, a laser beam 28 is used to generate the heat in a radiation-absorbing layer, such as the IR sensitive layer 22, cutting holes 21 in the IR sensitive layer 22 and polyester layer 24. During printing, ink 25 becomes accessible to paper 25 through holes 21. A high-resolution stencil may be quickly produced in this method. So far there is no commercial implementation of this method.

An example of an existing UV stencil for screen printing and of its preparation is illustrated in FIG. 3.

Stencil 30 is made of a UV curable material (photo polymer) 32 and a fine mesh 38. A photographic film 34, containing image 33, is laid over the photo polymer 32, and acts as a mask during the exposure of stencil 30, in a contact exposure process. The UV curable material hardens as it is exposed to UV light 36 through transparent areas 31 in the photographic film 34. The film 34 is removed and the stencil is washed out, in the developing process, leaving the mesh 38 and the cured material 39. The stencil is then used for printing ink 37 on paper 35. Ink 37 is inaccessible to paper 35 in the areas defined by the cured material 39, and will contact paper 35 only in the non cured areas 33' around the cured material 39. The Screen-printing stencils thus produced have relatively high quality. Numerous versions of this principle exist, with direct (on-mesh processing) and indirect (off-mesh processing) emulsions and photo polymer films.

FIG. 4 illustrates a digital flexographic printing plate and describes the method for its preparation, such as described in U.S. Pat. Nos. 5,262,275 and 5,607,814. The flexographic printing process is a relief printing process which does not utilize stencils. Flexographic plate 40 consists of a UV sensitive photo polymer 48 coated by a dense black IR sensitive layer 42. Layer 42 is etched out by a powerful IR laser 44, forming an integral mask having holes 43 through which the plate 48 is exposed to UV light 46. The UV exposure from light 46 forms, by curing, a relief image 41 on the plate. Additional exposure to UV lamp 49 forms a cured plate base 41'. After processing, relief image 41 can be used for printing ink 47 on paper 45. The process requires powerful exposures for both IR and UV light. It is as lengthy as for normal UV plates but it gives high quality since contact exposure with a film is no longer required.

UV curable material was utilized for screen printing, as described in FIG. 3 and for flexographic plate printing, as described in FIG. 4, but has never been utilized in the preparation of printing duplicating stencils and has never been used in an on-press process The existing methods for producing printing stencils for duplicating (such as described in the above patents and in FIGS. 1 and 2) are limited in the quality of stencils which can be produced due to various effects of the thermal interaction of the material either with the thermal head or with the laser. Present stencil duplicating is limited in its application to simple jobs with very coarse halftone images.

SUMMARY OF THE INVENTION

It is an object of the present invention to provide a printing stencil and a method for its preparation which overcome the limitations of the known printing stencils.

There is thus provided, in accordance with a preferred embodiment of the present invention, a printing stencil especially useful for stencil duplicating processes. The printing stencil comprises a porous stencil carrier layer, preferably of a non-woven tissue, which is impregnated with a solid or liquid radiation curable material. The printing stencil may further comprise a mask laid upon or integral to the stencil layer for defining areas transparent and areas non transparent to curing irradiation. The mask may be, for example, an IR sensitive layer or an ink jet printed layer in which the areas impermeable to curing radiation are areas not ablated by IR irradiation or areas containing ink.

There is thus also provided, in accordance with a preferred embodiment of the present invention, a method for the preparation of a printing stencil, said printing stencil comprising a stencil carrier layer and a stencil layer, which is impregnated with a radiation curable material. The method comprises the step of selectively irradiating the stencil layer with curing radiation, thereby forming ink permeable and ink impermeable areas, said ink permeable areas consisting of uncured material and said ink impermeable areas consisting of cured material.

In most cases, the uncured material is removed from the stencil, prior to printing, to form the ink permeable image areas.

The method may further comprise the step of creating a mask on the stencil layer prior to irradiating it with curing radiation, for selectively blocking curing radiation by defining, on the printing stencil, areas exposed and areas unexposed to curing radiation.

The mask may be removed prior to removing the uncured material from the stencil.

It will be appreciated that "area", in the present invention, refers to a surface of a layer, e.g. the mask, or to the full thickness of the layer under laying the surface, e.g. the impregnated stencil.

The printing stencil of the present invention may be used in stencil duplicating processes for printing fine details, graphic elements and color printing at a higher quality than existing stencils, approaching offset lithographic standards. Thus, the invention utilizes a technically simple process for achieving a quality presently achievable only in complicated printing processes.

DETAILED DESCRIPTION OF THE INVENTION

The present invention relates to a printing stencil and to a method for its preparation. The printing stencil comprises a stencil carrier layer impregnated with radiation curable material. The stencil carrier layer preferably consists of a non-woven tissue which is preferably made of a mixture of natural fibers and synthetic fibers. The stencil carrier layer is impregnated with a solid or liquid radiation curable material which polymerizes upon exposure to a curing radiation. The curable material may consist of a basic matrix, which is different for liquid and solid formulations, and photo initiators, which are specific for different curing radiation wave lengths.

During stencil making the curable material is imaged so that the non-image areas become cured, and thereby impermeable to ink, and the image areas (ink permeable areas) are left unexposed and uncured so that, eventually, they allow the ink to pass through. Due to the nature of radiation curing, and compared to stencils produced by thermal processes, a stencil thus produced can carry an image of very high resolution (more than 2000 pixel/inch), of high screen ruling (150 lines/inch or higher) and high detail definition. An advantage of the cured material, of the present invention, is, that it is mechanically strong so that it can withstand a long print run of at least several thousand copies. The cured surface is very smooth having a surface roughness (Rz) in the 1 micron region, resulting in high printing quality. No other stencil making processes can give the quality of this process. The process is suitable for on-press stencil making.

Figure 1:
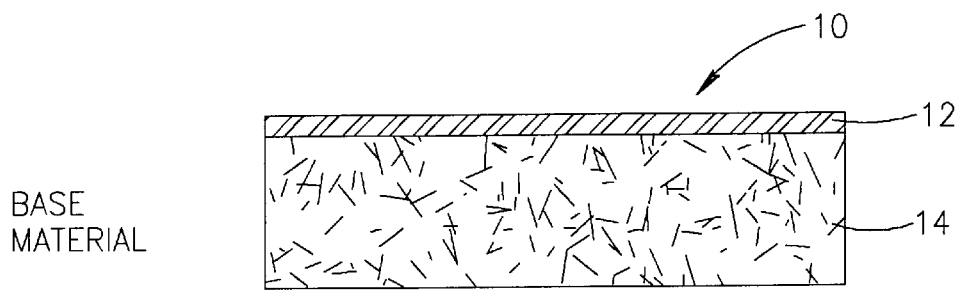
FIG. 1 illustrates a prior art thermal stencil and describes the method of its preparation.
Figure 1:
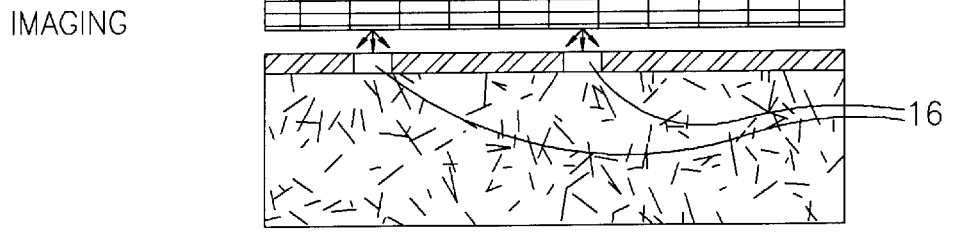
Figure 1:
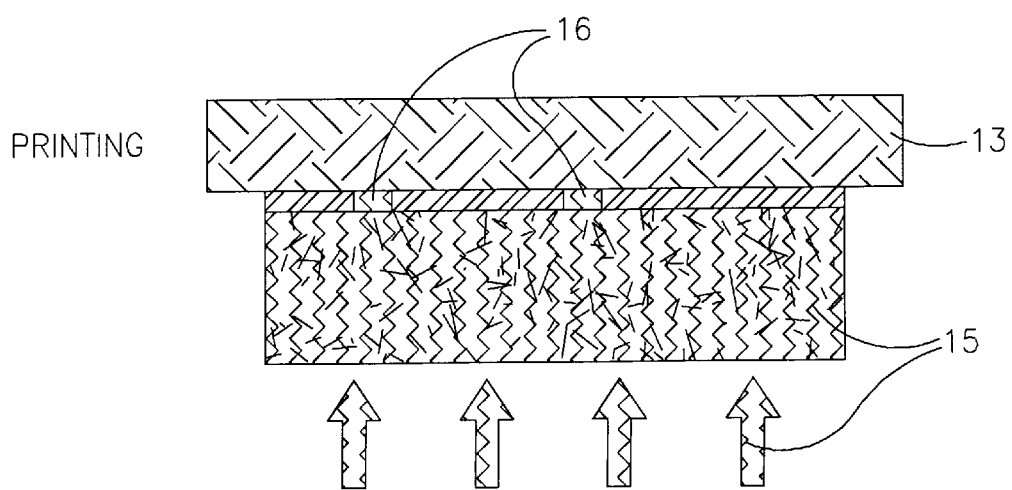
Figure 2:
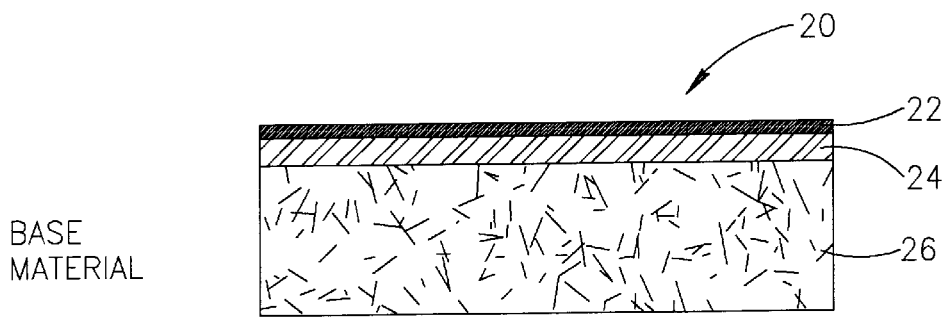
FIG. 2 illustrates a prior art laser thermal stencil and describes the method of its preparation.
Figure 2:
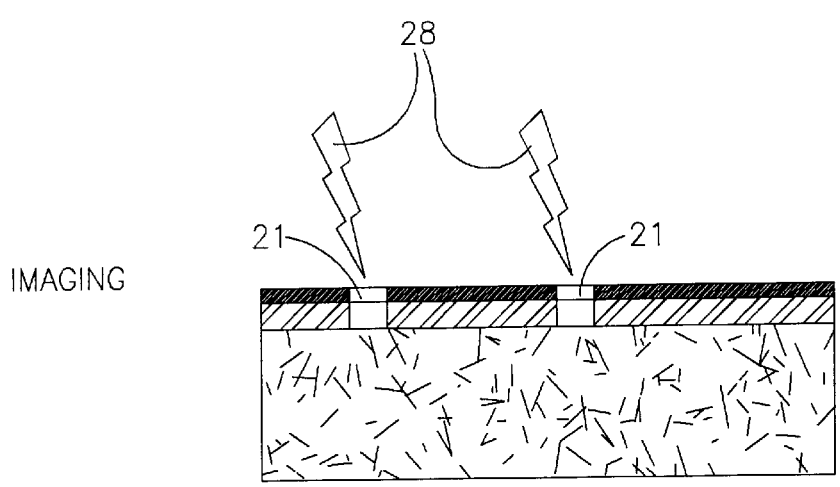
Figure 2:
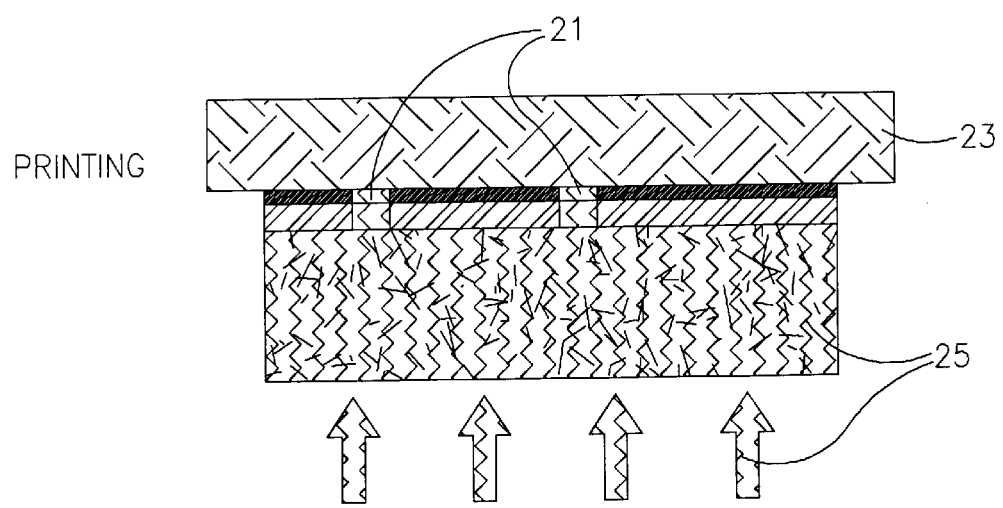
Figure 3:
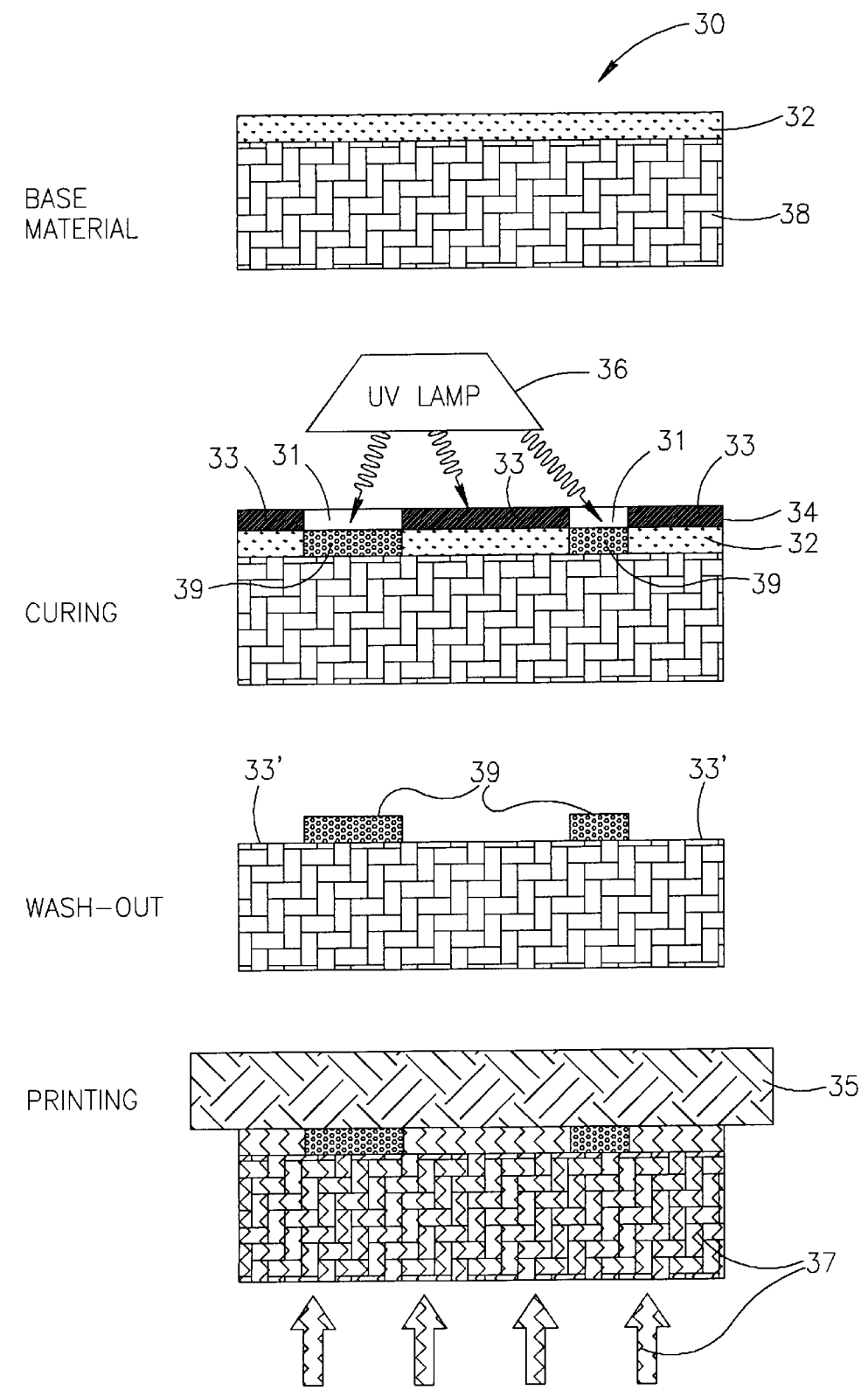
FIG. 3 illustrates a prior art screen printing UV stencil and describes the method of its preparation.
Figure 4:
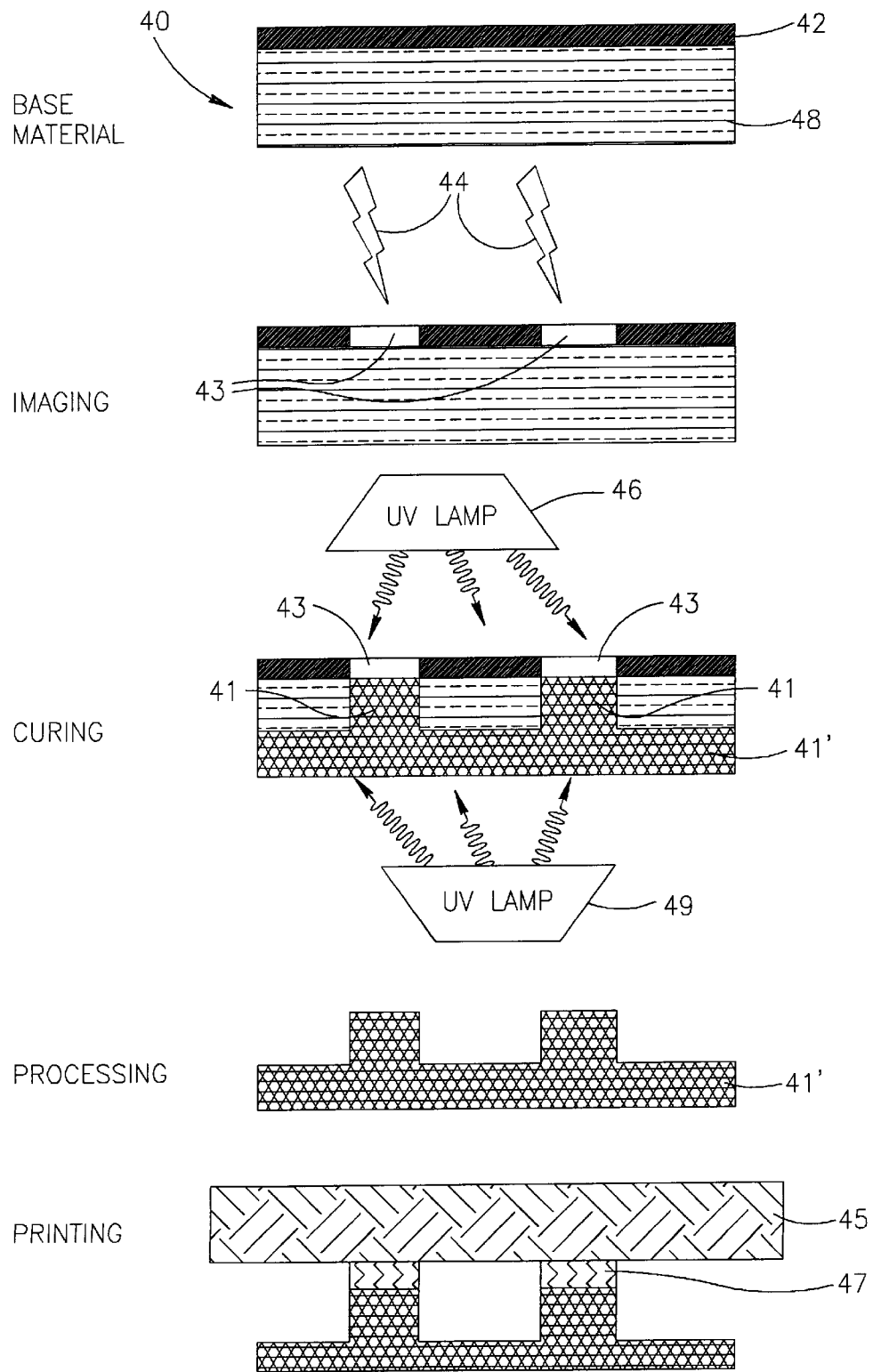
FIG. 4 illustrates a prior art digital flexographic plate and describes the method of its preparation.
Figure 5A:
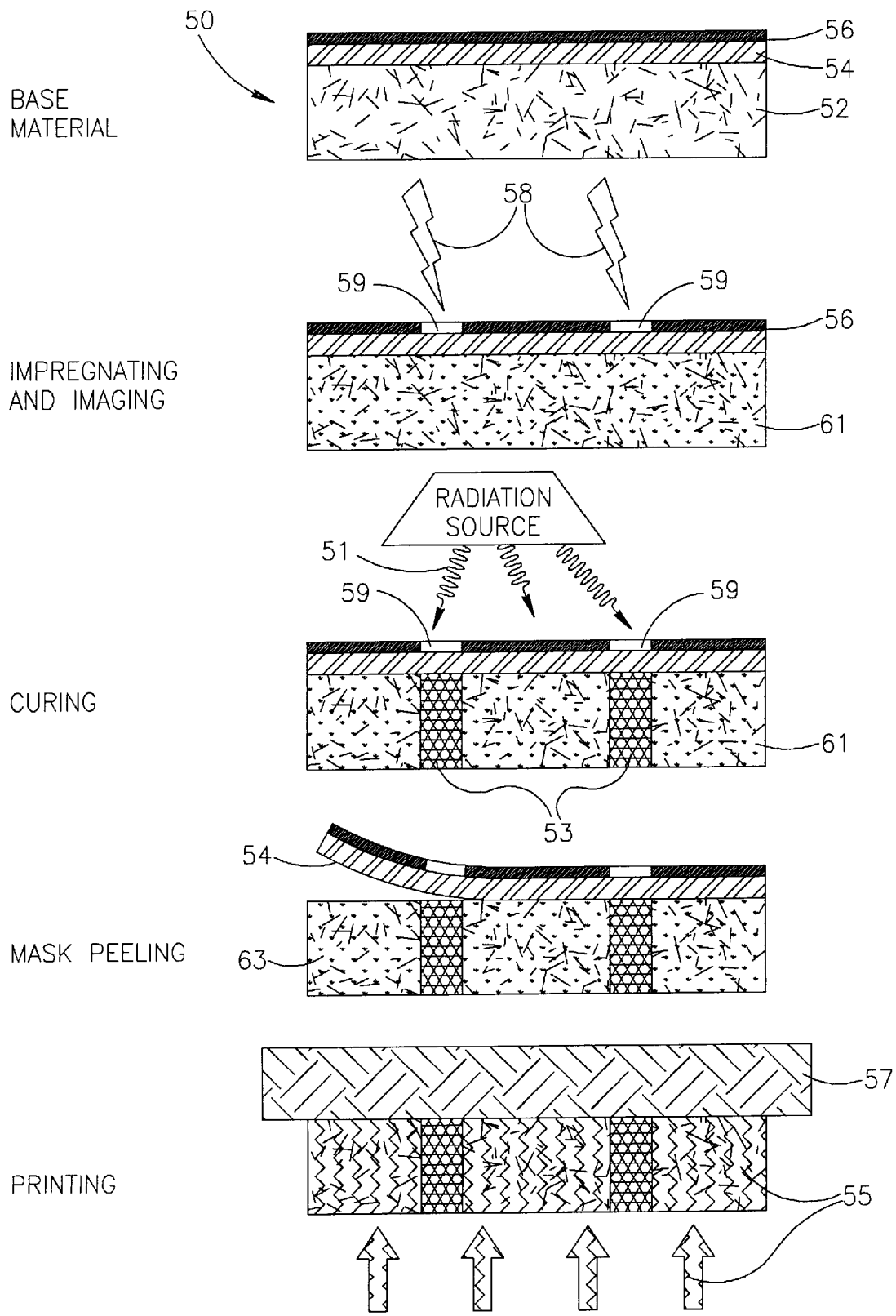
FIG. 5a illustrates a liquid UV curing stencil with an IR laser generated mask and describes the method of its preparation, according to a preferred embodiment of the present invention.
Figure 5B:
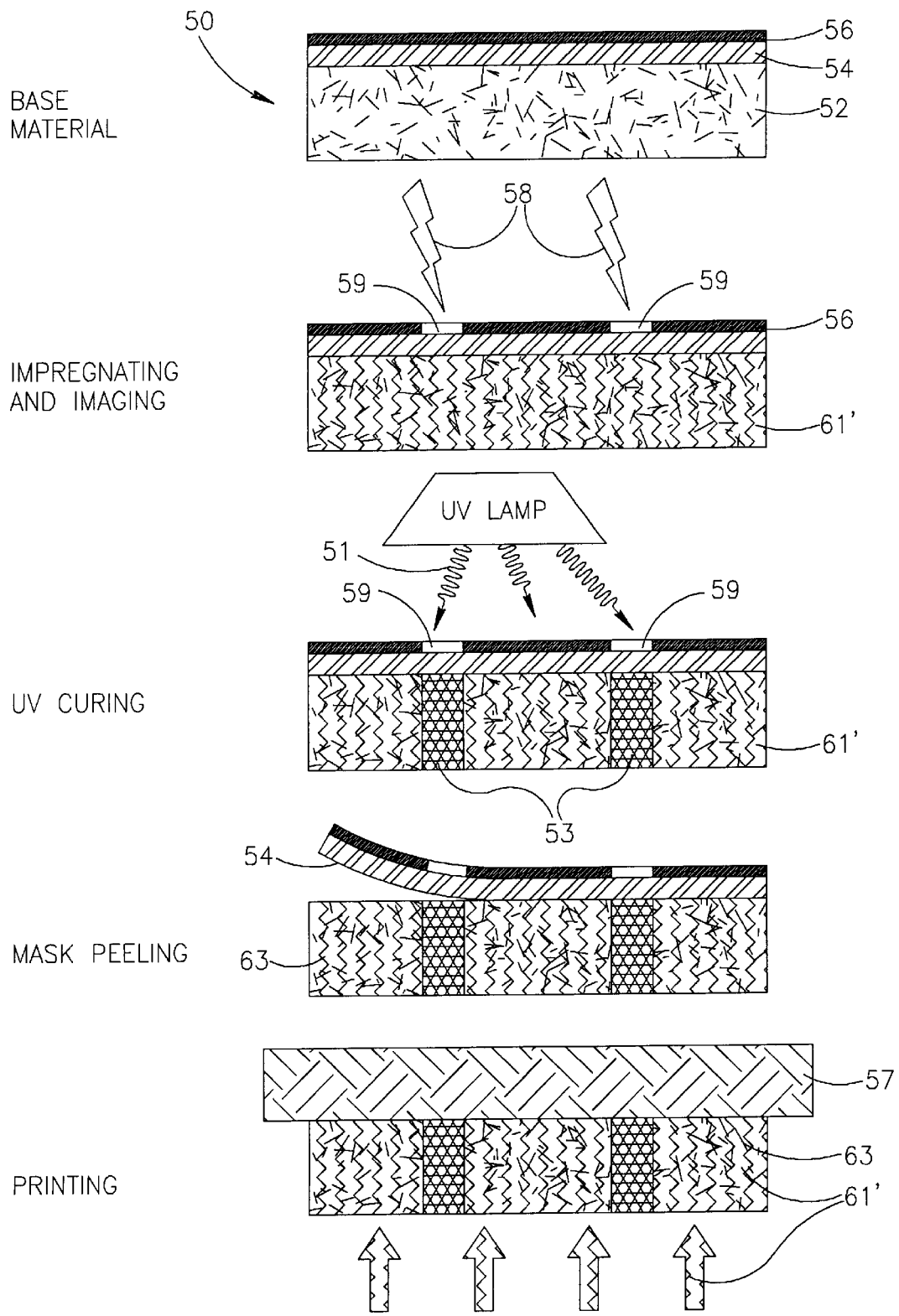
FIG. 5b illustrates a specific implementation of the stencil illustrated in FIG. 5a, in which the liquid UV curable material is a UV curable ink.
Figure 6:
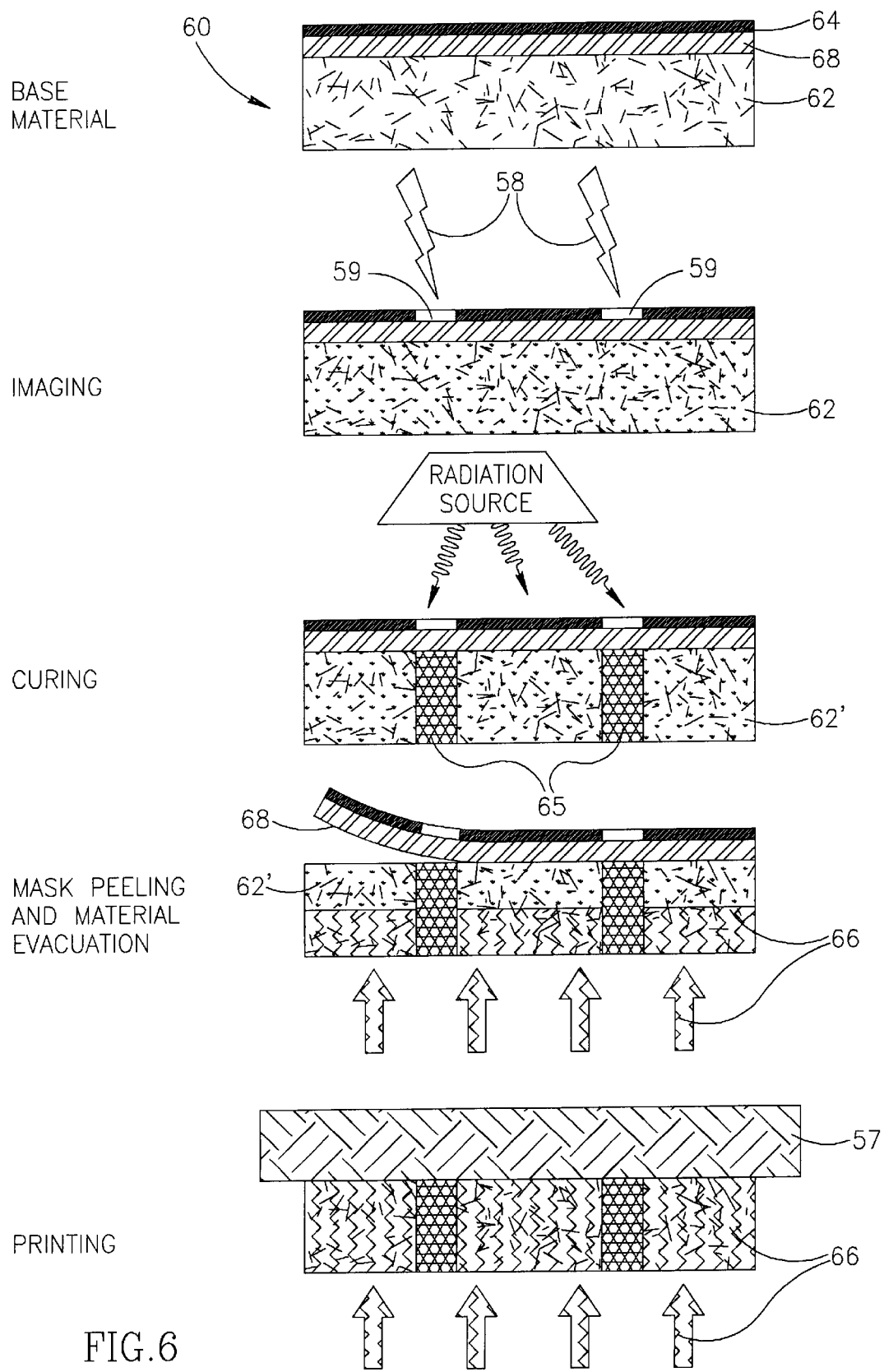
FIG. 6 illustrates a solid UV curing stencil with an IR laser generated mask and describes the method of its preparation, according to a preferred embodiment of the present invention.

Reference is now made to FIGS. 5a, 5b and 6 which illustrate a UV curing stencil with an IR laser generated mask, according to a preferred embodiment of the present invention.

FIGS. 5a and 5b relate to a liquid curable material. In FIG. 5a, the printing stencil generally referenced 50 consists of a stencil carrier layer which is a non-woven tissue layer 52, preferably made of a mixture of natural fibers, such as hemp, and synthetic fibers such as polyester fibers, and a thin transparent film 54, e.g. Bi-oriented polypropylene (BOPP) of 15–30 microns, laminating it. The film is coated with an IR absorbing layer 56 (for example, as described in the above mentioned IL patent U.S. application No. 09/402, 205). The tissue 52 is impregnated with liquid curable material, thus obtaining the impregnated stencil 61. The impregnated stencil 61 will then be exposed to curing radiation.

For example, liquid curable material consists of a mixture of a basic matrix and specific photo initiators. The basic matrix for liquid curable material comprises, for example, 20–60% Genomer 3456 (manufactured by Rahn, Zurich, Switzerland), 30–50% SR9021 (manufactured by Sartomer, Pa., USA), 5–15% CN 551 (manufactured by Cray Valley, Paris, France) and 2–8% Actilane 800 (manufactured by Akcros, Manchester, UK). Photo initiators used for UV radiation (200–400 nm) curable material are, for example, a mixture of 2–6% Speedcure EDB (manufactured by Lambson, Castleford, UK), 2–6% Velisicure BTF (manufactured by Rahn, Zurich, Switzerland), 0.5–1.5% Quantacure ITX (manufactured by Rahn, Zurich, Switzerland) and 0.5–1.5% Irgacure 651 (manufactured by Ciba, Basle, Switzerland). Photo initiators used for visible light curable material are, for 488 nm, for example, 0.2–1% Irgacure 784 (manufactured by Ciba, Basle, Switzerland) or 0.1–1.2% Genocure CQ (manufactured by Rahn, Zurich, Switzerland) and for 532 nm are, for example, a mixture of 2–6% Borate and dye combinations such as Ph3BBuNMe4, FPh3BHexNMe4 and MeS2NaphBMenMe4 (*New Electron transfer photo initiators for the visible and the IR Region*, K. Kuntz, A Cunnigham, C, De Leo/CIBA specialty chemicals Inc., Basle Switzerland, IS & T's 49th Annual Conference, 1996) and 0.1–0.5% Methylene Blue (supplied by Riedel DeHaen, Seelze, Germany). Photo initiators used for IR radiation (810–830 nm) curable material are, for example, a mixture of 1–5% Borate and dye combinations as above and 0.1–0.5% IR-786 (supplied by Aldrich, Wis., USA). The basic technology of producing radiation curable formulations, including visible and IR radiation, based on borate and dye combinations, is described in *Chemistry & Technology of UV and Eb formulation for coatings, ink & paints*, K. K. Dietliker Vol. 3, Chapter 9, SITA Technology Ltd., London, 1991. Recently developed IR sensitive photo initiators are described in *New Electron transfer photo initiators for the visible and the IR Region*, K. Kuntz, A Cunnigham, C, De Leo/CIBA specialty chemicals Inc., Basle Switzerland, IS & T's 49th Annual Conference, 1996.

IR sensitive layer 56 is selectively ablated by an IR laser 58, e.g. Nd YAG laser, to form an image in an exposure process. This image is then used as an integral mask for a global radiation exposure 51 (for example, using a conventional UV lamp). The global exposure cures the curable material of the impregnated stencil 61 through the radiation transparent areas (ablated areas) 59 in the IR sensitive layer 56 (mask), thus obtaining radiation cured volumes 53. Following this exposure, the film 54 is peeled off to allow the ink 55 to pass through and displace the uncured material 63. Displacement of the uncured material 63 creates ink transparent image areas, through which the ink 55 is able to pass to the paper 57.

FIG. 5b illustrates a specific implementation, in which the liquid curable material is a UV curable ink. A stencil carrier layer which is a non-woven tissue layer 52, such as described in FIG. 5a, is impregnated, prior to radiation exposure, with a UV curable ink, thus obtaining impregnated stencil 611.

For example, the UV curable ink may be of the UVISPEED series (manufactured by Sericol, Broadstairs, UK) or the UVN series (manufactured by Weiderhold, Nurenberg, Germany), which are Inks routinely used in screen printing.

An IR sensitive layer 56 is selectively ablated to create a mask, as described in FIG. 5a, and the stencil 61' is exposed through the mask as described in FIG. 5a.

In this implementation no special liquid curable material is required since the tissue layer 52 is impregnated with the liquid curable ink which is also used, later, for printing, during the printing process. UV radiation is routinely used in screen printing, to facilitate drying of the ink, The same UV radiation may be utilized, with only minor adjustments of the process, for curing the ink in the stencil 61', in the step prior to printing. Finally, the additional step, described in FIG. 5a, of removing uncured material, is not required in this implementation, since the uncured material is the same ink as used during printing. It is obvious to a person skilled in the art, that the advantages of this implementation are both in simplifying and facilitating an on-press process.

FIG. 6 relates to a solid, or semi solid, curable material. The method described in FIG. 6 is similar to the method described in FIGS. 5a and 5b except that the tissue layer (52 in FIGS. 5a and 5b) is impregnated, during its manufacture, with a curable material which is solid, thus obtaining impregnated stencil carrier layer 62. The cured areas 62 are obtained as described in FIG. 5a. The solid uncured material 62' becomes soluble when coming in contact with the printing ink 66.

The basic matrix of this curable material is, for example a mixture of 45–70% EBECRYL IRR 156 (manufactured by UCB Drogenboss, Belgium), 5–35% Actilane 165 (manufactured by Akoros Manchester, UK), 5–20% SR494 (manufactured by Sartomer Pa., USA). Specific photo initiators may be added as described for the process of FIG. 5a.

This method allows manufacturing the stencil 62 with a radiation curable material already inside the tissue. The solid material may carry the IR sensitive layer 64 on a special Image-carrying layer (BOPP) 68 or directly on itself, without the special image-carrying layer 68, thus simplifying the process. In this case, the process is further simplified by the fact that IR sensitive layer 64, which may be only several microns thick, may be displaced directly by the ink used during the printing process, by dissolving layer 64, without requiring a separate step of peeling prior to printing.

Displacement of uncured material, prior to printing, may be achieved by mechanically driving out uncured material, which has melted upon contact with the ink used for printing, or may be achieved by pulling off the polypropylene film, to which uncured material has adhered (cured material does not adhere to the film). Heating the impregnated stencil enhances both melting of the uncured material and adhering the uncured material to the polypropylene film, thereby facilitating the process of displacement.

Figure 7:
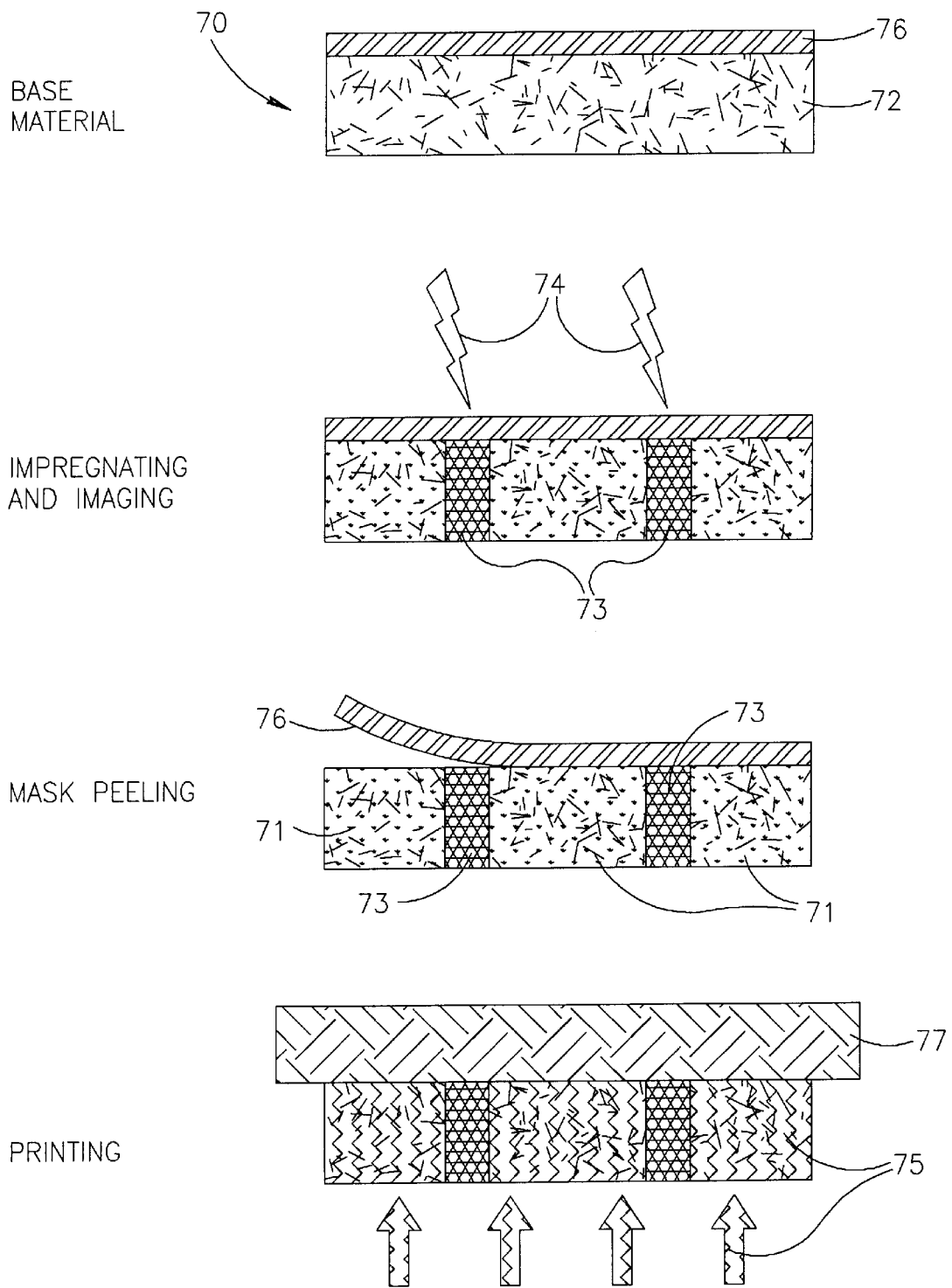
FIG. 7 illustrates direct laser curing of a liquid curing material stencil and describes the method of its preparation, according to a preferred embodiment of the present invention.
Figure 8:
FIG. 8 illustrates direct laser curing of a solid curing material stencil and describes the method of its preparation, according to a preferred embodiment of the present invention.
Figure 8:
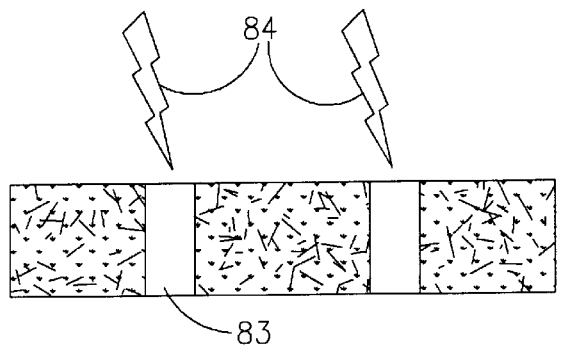
Figure 8:
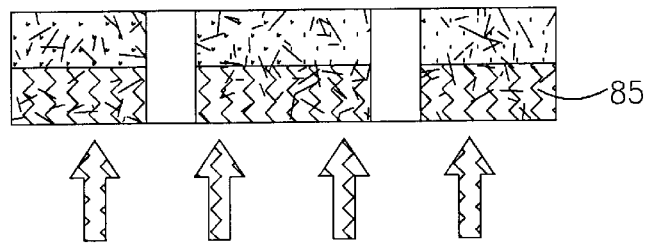
Figure 8:
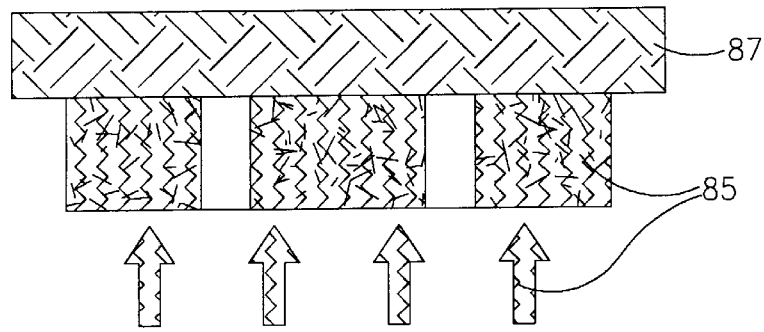

Reference is now made to FIGS. 7 and 8 which illustrate direct laser curing of a liquid (FIG. 7) or solid (FIG. 8) curing material stencil and describe the method of their preparation, according to a preferred embodiment of the present invention.

FIG. 7 illustrates a printing stencil, generally referenced 70, in which the tissue 72 is impregnated with liquid curable material. The material (such as described in FIGS. 5a and 5b) is imaged directly by radiation 74, such as from a UV source (e.g. third harmonic Nd YAG laser) or IR laser (e.g. a diode laser) or visible laser (e.g. second harmonic Nd YAG 532 nm or Argon laser 488 nm), and thus is cured selectively (volumes 73 are cured and volumes 71 are uncured) to form the printing stencil. Similar formulations to those mentioned in FIGS. 5a and 5b may be used for radiation curing with specific matching between the photoinitiator sensitivity and the laser wavelength. A cover film 76 (similar to the carrier film 54 of FIG. 5a) may be used on the liquid curable material impregnated stencil 72 in order to impart surface smoothness and facilitate the removal of uncured material 71, to form image areas. Ink 75 is then allowed to pass through the image areas to paper 77.

FIG. 8 illustrates a stencil 82 which is impregnated with solid curable material, during its manufacture. The material (such as described in FIG. 6) is imaged directly by radiation 84, such as described in FIG. 7, and thus is cured selectively (areas 83 are cured and areas 82' are uncured) to form the printing stencil. Similarly to the process described in FIG. 6, the solid uncured material 82' becomes soluble when coming in contact with the printing ink 85, allowing the ink 85 to pass to paper 87. This process is simplified by the fact that no cover film (such as 76 of FIG. 7) is required to impart surface smoothness to the stencil.

Figure 9:
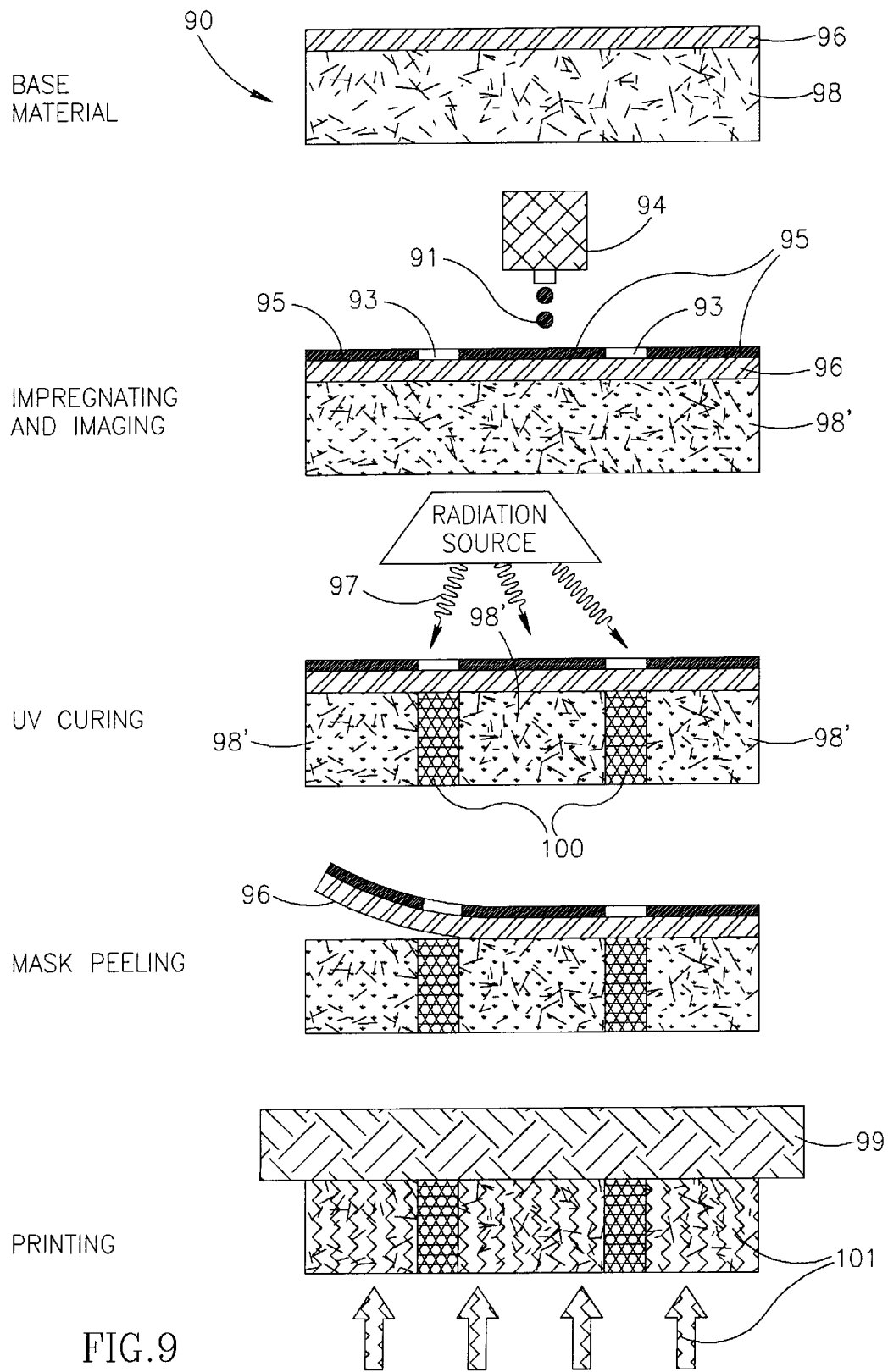
FIG. 9 illustrates a UV curing stencil with an ink jet printing generated mask and describes the method of its preparation, according to a preferred embodiment of the present invention.

Reference is now made to FIG. 9 which illustrates a UV curing stencil with an ink jet printing generated mask. This stencil, generally referenced 90, and the method for its preparation are similar to those described in FIG. 5a, 5b and 6. However, the mask image is not realized by laser ablation, but with ink jet printing of black ink 91. Ink 91 is applied by a drop on demand process by an inkjet head 94 as used in common industrial or even domestic ink jet printers. An ink jet printed layer 92, containing areas having ink 95 and areas not containing ink 93, is applied on the curable material impregnated stencil 98. The ink may be printed directly on the curable material impregnated stencil 98 (when a solid or semi solid curable material is used, such as described in FIG. 6) or on a cover film 96 overlaying the curable material impregnated stencil 98 (when liquid curable material is used, such as described in FIGS. 5a and 5b). Printed layer 92 acts as a mask for obtaining selectively cured areas or volumes 100, when stencil 98 is exposed to curing radiation 97. The printed layer 92 is removed together with the uncured material 98', if printed directly on to stencil 98, or together with the peeling of the cover film 96, prior to removing the uncured material 98'. This method is relatively inexpensive to implement, since the cost of ink jet heads 94 is much lower than the cost of a powerful IR laser.

It will be appreciated by persons skilled in the art that the present invention is not limited by what has been particularly shown and described herein above. The principle of radiation curing stencil may be implemented in various methods. These methods differ in the type of cured material (solid or liquid), their wave length sensitivity and in the way that the digital image is applied, and possibly in some process details.

Rather the scope of the invention is defined by the claims which follow:

What is claimed is:

1. A printing stencil comprising:
   a porous stencil carrier layer comprising a non-woven tissue; and
   a radiation curable material impregnated within said non-woven tissue such that radiation curing of said stencil layer creates cured and uncured areas, said cured areas substantial blocking ink flow and said uncured areas remaining sufficiently porous to allow ink flow through said stencil layer.

2. The printing stencil according to claim 1 wherein the radiation curable material is solid before curing.

3. The printing stencil according to claim 1 wherein the radiation curable material is liquid before curing.

4. The printing stencil according to claim 1 wherein the radiation curable material is an ink which is also useable in a printing process.

5. The printing stencil according to claim 1 further comprising a mask laid upon or integral to said printing stencil for selectively blocking curing radiation.

6. The printing stencil according to claim 5 wherein the mask is a layer having areas which are transparent to curing radiation and areas which are non transparent to curing radiation.

7. The printing stencil according to claim 6 wherein the mask is an IR sensitive layer or an ink jet printed layer and wherein the areas which are transparent to curing radiation are areas ablated by IR radiation or areas clean of ink and the areas non transparent to curing radiation are areas not ablated by IR irradiation or areas containing ink.

8. A method for the preparation of a printing stencil comprising:
   providing a porous stencil carrier of a non-woven tissue;
   impregnating said non-woven tissue with a radiation curable material, and
   selectively irradiating said printing stencil with curing radiation to form ink permeable and ink impermeable areas, said ink permeable areas including portions of uncured material and said ink impermeable areas including portions of cured material.

9. The method according to claim 8 wherein selectively irradiating the printing stencil is by directly irradiating selected areas on the stencil with curing radiation.

10. The method according to claim 8 further comprising creating a mask on the stencil layer prior to irradiating it with curing radiation, for defining, on the printing stencil, areas exposed and areas unexposed to curing radiation.

11. The method according to claim 10 wherein selectively irradiating the printing stencil is by irradiating the whole stencil layer with the mask on it.

12. The method according to claim 10 wherein creating a mask on the stencil layer is by applying to the stencil layer a layer selectively blocking the curing radiation.

13. The method according to claim 12 wherein the layer selectively blocking the curing radiation is an IR sensitive layer or an ink let printed layer, and
   wherein selctively blocking the curing radiation is by selectively irradiating said IR sensative layer with IR radiation thereby forming ablated and unablated areas, said unablated areas defining the areas unexposed to curing radiation on the printing stencil,
   or by ink jet printing, said ink jet printed layer obtaining areas having ink, said areas having ink defining the areas unexposed to curing radiation on the printing stencil.

14. The method according to claim 8 further comprising a step of removing the uncured material from the stencil.

15. The method according to claim 8 wherein the radiation curable material is an ink which is also useable in a printing process.

16. The method according to claim 10 further comprising a step of removing the mask.

17. The method according to claim 16 further comprising a step of removing the uncured material from the stencil simultaneously with or following the removal of the mask.

18. A printing stencil comprising a porous stencil carrier layer including a non-woven material, said non-woven material impregnated with a radiation curable material, said stencil carrier layer adapted for selective exposure to curing radiation for creating ink permeable areas and ink impermeable areas of said stencil carrier layer once said stencil carrier layer has been selectively exposed to said curing radiation.

* * * * *